(12) United States Patent
Oh et al.

(10) Patent No.: US 9,870,759 B2
(45) Date of Patent: Jan. 16, 2018

(54) MULTI LAYER DISPLAY APPARATUS

(71) Applicant: Samsung Electronics Co., Ltd., Suwon-si (KR)

(72) Inventors: Byung Tae Oh, Seoul (KR); Hong Pyo Kim, Goyang-si (KR); Ho Young Lee, Suwon-si (KR); Seung Hoon Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 76 days.

(21) Appl. No.: 14/010,789

(22) Filed: Aug. 27, 2013

(65) Prior Publication Data

US 2014/0184669 A1    Jul. 3, 2014

(30) Foreign Application Priority Data

Dec. 27, 2012 (KR) ........................ 10-2012-0154841

(51) Int. Cl.
| | |
|---|---|
| *G09G 5/377* | (2006.01) |
| *G09G 3/00* | (2006.01) |
| *H01L 27/32* | (2006.01) |
| *G09G 3/3208* | (2016.01) |

(52) U.S. Cl.
CPC ............ *G09G 5/377* (2013.01); *G09G 3/007* (2013.01); *G09G 3/3208* (2013.01); *H01L 27/3218* (2013.01); *H01L 27/3237* (2013.01); *G09G 2300/023* (2013.01); *G09G 2300/0452* (2013.01); *G09G 2320/0626* (2013.01); *G09G 2340/0407* (2013.01); *H01L 2251/5323* (2013.01)

(58) Field of Classification Search
CPC ... G09G 3/007; G09G 5/377; G09G 2300/023
USPC ......................................................... 345/4–6
See application file for complete search history.

(56) References Cited

U.S. PATENT DOCUMENTS

| | | | |
|---|---|---|---|
| 5,124,818 A | 6/1992 | Conner et al. | |
| 6,232,938 B1* | 5/2001 | Tsuchida .............. | G09G 3/3648 345/103 |
| 8,547,297 B1* | 10/2013 | Hoppenstein ........ | G09G 3/3406 345/3.3 |
| 8,711,061 B2* | 4/2014 | Reichow .................. | G09G 3/36 345/102 |
| 2001/0035851 A1 | 11/2001 | Komatsu et al. | |

(Continued)

FOREIGN PATENT DOCUMENTS

| | | |
|---|---|---|
| CN | 101636689 A | 1/2010 |
| CN | 201717264 U | 1/2011 |

(Continued)

OTHER PUBLICATIONS

Partial European Search Report dated Feb. 24, 2016 for corresponding EP Application No. 13190596.0.

(Continued)

*Primary Examiner* — David Tung
(74) *Attorney, Agent, or Firm* — Harness, Dickey & Pierce, P.L.C.

(57) ABSTRACT

A multilayer display apparatus for outputting a single integrated image includes a plurality of layer displays to represent an image, and an image control unit to control a single integrated image to be output through overlapping images represented by the plurality of layer displays.

11 Claims, 5 Drawing Sheets

(a)

(b)

(56) References Cited

U.S. PATENT DOCUMENTS

| | | |
|---|---|---|
| 2003/0132446 A1 | 7/2003 | Guenther et al. |
| 2005/0024339 A1 | 2/2005 | Yamazaki et al. |
| 2007/0279315 A1 | 12/2007 | Laves et al. |
| 2009/0091582 A1 | 4/2009 | Ajito et al. |
| 2011/0043435 A1 | 2/2011 | Hebenstreit et al. |
| 2011/0176260 A1 | 7/2011 | Walters et al. |
| 2011/0241974 A1 | 10/2011 | Manning |
| 2012/0056902 A1 | 3/2012 | Yoshino |
| 2012/0206386 A1 | 8/2012 | Xu et al. |

FOREIGN PATENT DOCUMENTS

| | | |
|---|---|---|
| CN | 102110393 A | 6/2011 |
| CN | 102282535 A | 12/2011 |
| EP | 1466371 A1 | 10/2004 |
| EP | 1598796 A1 | 11/2005 |
| EP | 1884919 A1 | 2/2008 |
| TW | 587348 B | 5/2004 |

OTHER PUBLICATIONS

Chinese Office Action dated Jun. 2, 2016 for corresponding Chinese Application No. 201310469775.9.
European Office Action dated Apr. 21, 2017 for corresponding European Application No. 13190596.0.

* cited by examiner

MULTI LAYER DISPLAY APPARATUS

CROSS-REFERENCE TO RELATED APPLICATIONS

This application claims the priority benefit of Korean Patent Application No. 10-2012-0154841, filed on Dec. 27, 2012, in the Korean Intellectual Property Office, the disclosure of which is incorporated herein by reference.

BACKGROUND

1. Field

The following description relates to a multilayer display apparatus for displaying a high resolution image by overlapping a plurality of layer displays.

2. Description of the Related Art

With recent developments of image technology and transparent electronic device-related technology, research is being conducted in earnest into a display device with a transparent display screen. A transparent display device may display a letter or an image on a display screen while maintaining transparency of the display screen. The transparent display device may include a transparent electronic device configured by a transparent substrate such as a glass substrate, an electrode manufactured by a transparent material, a semi-conductor, an insulator, and the like. An essential part of a configuration of the transparent electronic display device, in particular, a display panel, may use a transparent device, such as an organic electro luminescence device (OLED), a photoluminescence device, and the like, rather than a liquid crystal display (LCD).

SUMMARY

The foregoing and/or other aspects are achieved by providing a multilayer display apparatus, the apparatus including a plurality of layer displays to represent an image, and an image control unit to control an integrated image to be output through the image represented by the plurality of layer displays being overlapped.

The plurality of layer displays may represent an image based on a plurality of differing pixel arrays.

The plurality of layer displays may represent an image based on non-overlapping pixel arrays.

The pixel arrays may be dispositions at which pixels representing an image are disposed in an alternating manner between the plurality of layer displays, and the pixels representing the image are disposed vertically or horizontally in each of the layer displays.

The pixel arrays may be dispositions at which pixels representing an image are disposed in an alternating manner between the plurality of layer displays, and the pixels representing the image are disposed in a grid structure in each of the layer displays.

The plurality of layer displays may represent an image based on a plurality of sub-pixel dispositions.

The plurality of layer displays may include a plurality of sub-pixels of different colors disposed in an alternating manner between the plurality of layer displays.

The plurality of layer displays may represent an image based on non-overlapping sub-pixel arrays.

The image control unit may selectively display sub-pixels of the plurality of layer displays to control a single integrated image to be output.

The image control unit may adjust a brightness of an image for the plurality of layer displays based on a relative position relationship between the plurality of layer displays.

The image control unit may adjust a brightness of an image of a layer display in a background to be brighter than a brightness of an image of a layer display in a foreground.

The image control unit may correct an image to be represented on a layer display based on an alignment state of the plurality of layer displays, and using the plurality of layer displays, outputs the corrected image.

The plurality of layer displays may be a transparent display through which light is transmitted.

The plurality of layer displays may represent an image independently when the plurality of layer displays is divided.

The image control unit may output an enlarged image to the plurality of divided layer displays when the plurality of layer displays is divided.

The foregoing and/or other aspects are achieved by providing a multilayer display apparatus for outputting a single integrated image through overlapping a plurality of layer displays representing an image independently when the plurality of layer displays is divided.

The foregoing and/or other aspects are achieved by providing a method of forming a composite image including a first image and a second image, the method including displaying the first image on a first display, and displaying the second image on a transparent second display stacked on a front surface of the first display, where the first image is displayed through the second display to form the composite image.

Additional aspects of embodiments will be set forth in part in the description which follows and, in part, will be apparent from the description, or may be learned by practice of the disclosure.

BRIEF DESCRIPTION OF THE DRAWINGS

These and/or other aspects will become apparent and more readily appreciated from the following description of embodiments, taken in conjunction with the accompanying drawings of which.

DETAILED DESCRIPTION

Figure 1:
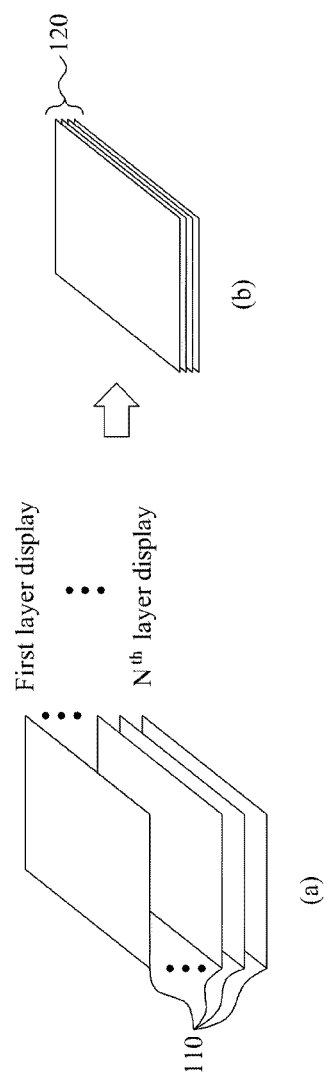
FIG. 1 illustrates a structure of a multilayer display apparatus according to example embodiments.

Reference will now be made in detail to embodiments, examples of which are illustrated in the accompanying drawings, wherein like reference numerals refer to the like elements throughout. Embodiments are described below to explain the present disclosure by referring to the figures.

FIG. 1 illustrates a structure of a multilayer display apparatus according to example embodiments.

A plurality of layer displays 110 may each represent an image independently. Each of the plurality of layer displays 110 may be a transparent display that transmits light. For example, each of the plurality of layer displays 110 may be a display manufactured using a transparent electronic device including a transparent semi-conductor, a transparent conductor, and a transparent insulator. Accordingly, each of the plurality of layer displays 110 may transmit an image produced by another layer display.

The multilayer display apparatus may be formed by overlapping the plurality of layer displays 110 as shown in (a). For example, the multilayer display apparatus may include a stack structure 120 of the plurality of layer displays 110 as shown in (b). The stack structure 120 of the plurality of layer displays 110 may refer to a tier structure of at least two layer displays 110, to form a three-dimensional (3D) layer.

The layer display positioned at the rear of the plurality of layer displays 110 configuring the multilayer display apparatus, based on a view point of a viewer, may not be a transparent display, because transmission of an image from another layer display is not required. However, the rear layer display may be a transparent display as well.

The multilayer display apparatus may control a single integrated image to be output by overlapping an image represented by the plurality of layer displays 110. The multilayer display apparatus may control an image to be represented by the plurality of layer displays 110 based on a number of the plurality of layer displays 110, a pixel array of the plurality of layer displays 110, or a sub-pixel array.

The multilayer display apparatus may convert an image to be suitable for a pixel structure of the plurality of layer displays 110, and represent the converted image through a corresponding layer display. Also, the multilayer display apparatus may control the image to be represented by the plurality of layer displays 110 to be synchronized.

When viewed from the view point of the viewer, images represented through the plurality of layer displays 110 in the stack structure 120 may be displayed as a single image by being overlapped with one another. The multilayer display apparatus may overlap the plurality of layer displays 110 to output a higher resolution image.

The plurality of layer displays 110 in the stack structure 120 configuring the multilayer display apparatus may be divided as necessary. Each of the plurality of divided layer displays may represent an image independently. Accordingly, each of the plurality of layer displays 110 in the stack structure 120 may represent a different image to several users by being divided. The multilayer display may use a first layer display to display a first image for a first user and a second layer display to display a second image for a second user. Alternatively, the multilayer display may use any combination of the plurality of layer displays to display an independent image for each of a plurality of users.

Alternatively, the multilayer display apparatus may output an enlarged image using the plurality of divided layer displays. For example, when a plurality of layer displays of an identical size in the stack structure 120 is divided into an N number to output an image on the same display, the multilayer display apparatus may output an image of which a size is N times greater than a size of an image being output on a single layer display. Accordingly, a user may be provided with a display device with a wider screen.

The user may determine a number of layer displays to be divided, and select a size of a screen to output an image. The multilayer display apparatus may determine a size of an image to be output based on a number of the plurality of layer displays divided by the user, and output the image of which the size is determined through the plurality of layer displays.

For example, when a total number of layer displays is four, and a respective screen size of the four layer displays is "B", a display apparatus in a screen size of "B" may be provided in a case in which the total of layer displays forms a stack structure by being overlapped with each other. Additionally, in a case in which the plurality of layer displays forms a double-layered stack structure, a display apparatus in a screen size of "2*B" may be provided. In a case in which the total of layer displays outputs an image on an identical surface, a display apparatus in a screen size of "4*B" may be provided. A multilayer display apparatus may output an image corresponding to a current screen size of a display apparatus, through detecting the screen size.

Figure 2:
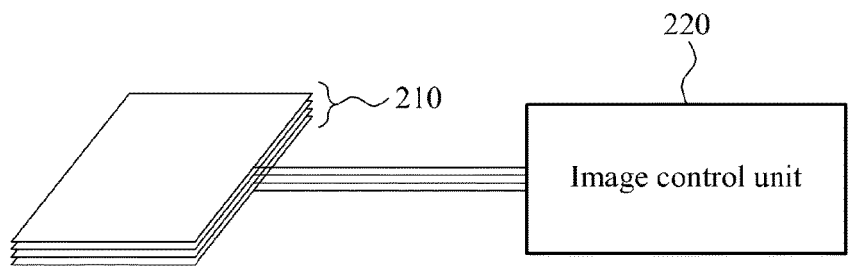
FIG. 2 illustrates an operation of a multilayer display apparatus according to example embodiments.

FIG. 2 illustrates an operation of a multilayer display apparatus according to example embodiments.

Referring to FIG. 2, the multilayer display apparatus may include a plurality of layer displays 210 and an image control unit 220.

The plurality of layer displays 210 may form a stack structure by being overlapped with each other. Each of the plurality of layer displays 210 may transmit an image represented by another layer display. Accordingly, from a view point of a viewer, an image represented by the plurality of layer displays 210 may be overlapped and displayed as a single integrated, or combination, image.

A pixel array in which the plurality of layer displays 210 represents an image may differ from the plurality of layer displays 210, and the plurality of layer displays 210 may represent an image based on a plurality of differing pixel arrays.

For example, the plurality of layer displays 210 may represent an image based on non-overlapping pixel arrays. More particularly, an area in which a pixel representing an image on one layer display and another area in which a pixel on another layer display may be provided in a position at which the pixels do not overlap. Accordingly, images represented by the plurality of layer displays 210 may be represented by being mixed, and a higher resolution display may be implemented.

For example, the non-overlapping pixel array may be positions at which pixels representing an image are disposed in an alternating manner in the plurality of layer displays 210, and the pixels representing the image are disposed vertically or horizontally in each of the layer displays 210. Alternatively, the non-overlapping pixel array may be positions at which pixels representing an image are disposed in an alternating manner in the plurality of layer displays 210, and the pixels representing the image are disposed in a grid structure horizontally in each of the layer displays 210. For example, pixels in the plurality of layer displays 210 may be disposed in an alternating form, such as in the form of a checker board, for example. The multilayer display apparatus may implement a full resolution using the aforementioned pixel array in the plurality of layer displays 210.

When pixels are disposed in the alternating grid structure in the plurality of layer displays 210, the pixels may be disposed by relatively minute changes being made to a position of a pixel rather than disposing the pixels in a precise grid format. Thus, an occurrence of a moiré or an artifact within an image may be minimized.

The multilayer display apparatus may implement a layer-based display using the plurality of layer displays 210 in a plurality of differing pixel arrays. More particularly, the plurality of layer displays 210 may represent an image based on a plurality of sub-pixel arrays.

The plurality of layer displays 210 may include a plurality of sub-pixels in different colors disposed in an alternating manner in the plurality of layer displays 210. For example, sub-pixels displaying a red, green, and blue (RGB) color in the plurality of layer displays 210 may be disposed in an alternating manner.

For example, in a case of the RGB color, an array order of a sub-pixel of a red (R) color, a sub-pixel of a green (G) color, and a sub-pixel of a blue (B) color may be set differently for each of the plurality of layer displays 210 to increase a resolution. The array order of the sub-pixels may be applied to either a horizontal direction or a vertical direction.

The image control unit 220 may control a single integrated image to be output by overlapping images represented by the plurality of layer displays 210. The image control unit 220 may match a synchronization of an image to be displayed through the plurality of layer displays 210, or adjust a brightness of the integrated image.

The image control unit 220 may adjust a brightness of an image represented by the plurality of layer displays 210 or a brightness of a screen, based on a relative position relationship between the plurality of layer displays 210. For example, the image control unit 220 may adjust a brightness of an image of a layer display in a background to be brighter than a brightness of an image of a layer display in a foreground, based on a view point of a viewer. Accordingly, the image control unit 220 may control a brightness of an image output through the multilayer display apparatus to be identical throughout a total of areas, based on a view point of a viewer.

The image control unit 220 may correct an image to be represented in a layer display based on an alignment state of the plurality of layer displays 210, and output the corrected image using the plurality of layer displays 210.

For example, the image control unit 220 may detect the alignment state between the plurality of layer displays 210 using a sensor, for example, and adjust a position of a pixel corresponding to a pixel value of an image for the plurality of layer displays 210 based on the detected alignment state.

The image control unit 220 may control a single image to be output by selectively displaying sub-pixels of the plurality of layer displays 210. The image control unit 220 may set a non-overlapping sub-pixel array between the plurality of layer displays 210, and the plurality of layer displays 210 may represent an image based on the non-overlapping sub-pixel array.

A method in which the multilayer display apparatus implements a layer-based display by changing a sub-pixel array within the plurality of layer displays 210 may be applied in a similar manner to another pixel array such as cyan, magenta, yellow, and black (CMYK) array, or a red, green, blue, and white (RGBW) array, for example.

Figure 3:
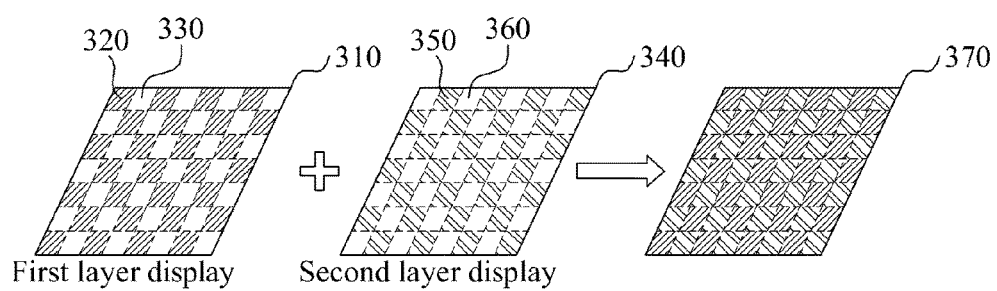
FIG. 3 illustrates an operation of outputting an image by overlapping a plurality of layer displays according to example embodiments.

FIG. 3 illustrates an operation of outputting an image by overlapping a plurality of layer displays 310 and 340 according to example embodiments.

Referring to FIG. 3, a multilayer display apparatus may include a first layer display 310 and a second layer display 340. Pixels 320 and 350 representing an image in the first layer display 310 and the second layer display 340, respectively, may be disposed in a grid structure.

Areas 330 and 360 in which an image is not represented may exist in the first layer display 310 and the second layer display 340. The areas 330 and 360 may allow external light to pass through due to being transparent.

The first layer display 310 and the second layer display 340 may include a non-overlapping pixel array. When the first layer display 310 and the second layer display 340 form a stack structure by being overlapped, an image of another layer display may be transmitted in the areas 330 and 360 in which the image is not represented in the plurality of layer displays 310 and 340.

Accordingly, an image 370 to be represented to a view point of a viewer may be represented by overlapping an image represented by the first layer display 310 and an image represented by the second layer display 340. In this instance, a representation in which an image is output throughout a total of display areas of the multilayer display apparatus may be obtained. The image 370 viewed from the view point of the viewer may be represented in a higher resolution than an image represented by each of the first layer display 310 or the second layer display 340 individually.

The multilayer display apparatus may adjust a brightness of an image of the plurality of layer displays 310 and 340 based on a relative position relationship between the plurality of layer displays 310 and 340. For example, when the second layer display 340 is positioned farther to a rear than the first layer display 310 based on the view point of the viewer, the multilayer display apparatus may adjust a brightness of an image represented by the second layer display 340 to be brighter than a brightness of an image represented by the first layer display 310. Accordingly, the multilayer display apparatus may compensate for a change in a brightness of an image occurring when the image represented by the second layer display 340 transmits the first layer display 310 and a difference in a brightness of an image due to a distance difference from the view point of the viewer.

The multilayer display apparatus may determine an alignment state of the first layer display 310 and the second layer display 340, and based on a result of the determination, correct an image to be represented by the plurality of layer displays 310 and 340. Accordingly, the multilayer display apparatus may minimize an irregularity between images represented in the plurality of layer displays 310 and 340 although the plurality of layer displays 310 and 340 is not disposed in a precise alignment.

Figure 4:
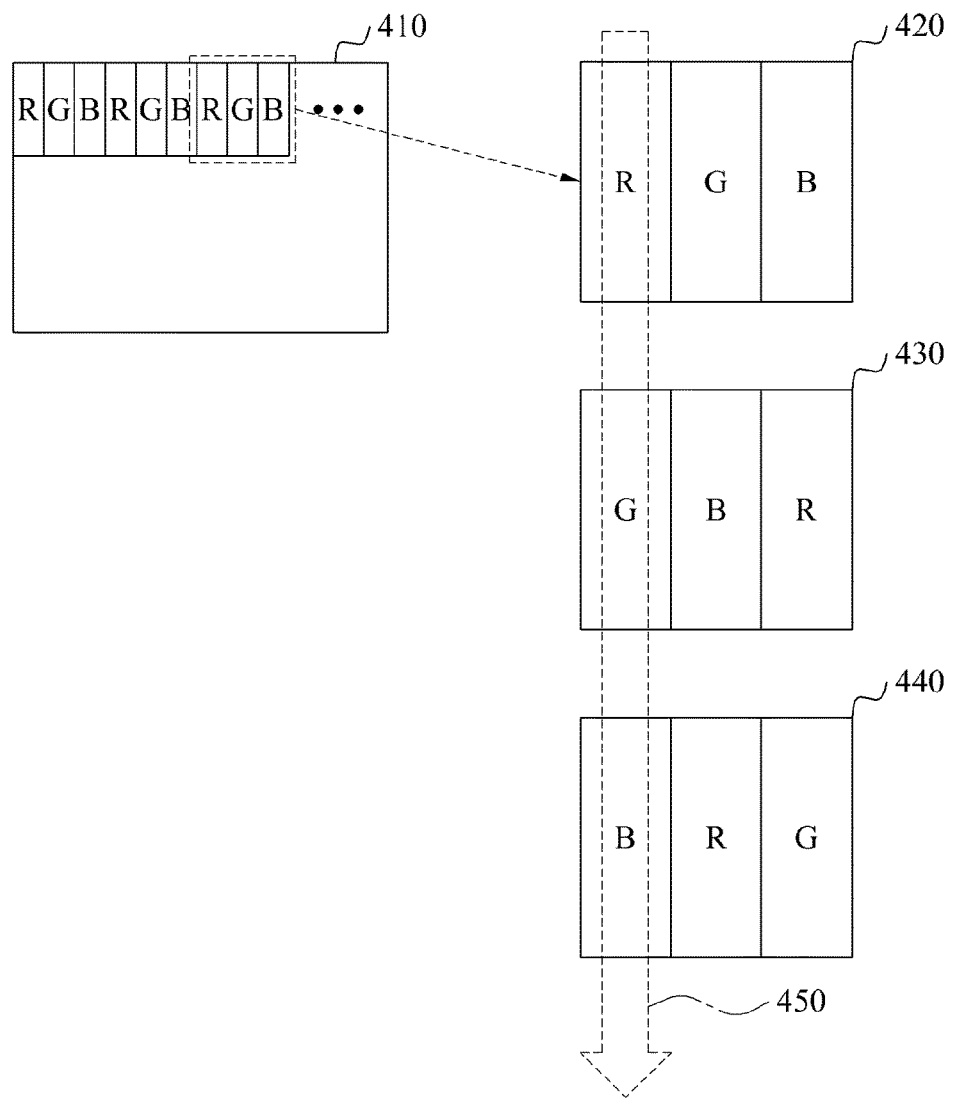
FIG. 4 illustrates an operation of outputting a high resolution image using a plurality of sub-pixel arrays according to example embodiments.

FIG. 4 illustrates an operation of outputting a high resolution image using a plurality of sub-pixel arrays according to example embodiments.

A multilayer display apparatus may implement a layer-based display using a plurality of layer displays including the plurality of differing pixel arrays. Referring to FIG. 4, the plurality of layer displays may include sub-pixels displaying an RGB color.

When a first layer display 410 includes an array with an R sub-pixel, a G sub-pixel, and a B sub-pixel alternate, a single pixel 420 in the first layer display 410 may be disposed with a sequence of the R sub-pixel, the G sub-pixel, and the B sub-pixel.

The plurality of display layers configuring the multilayer display apparatus may include a sub-pixel array in which a plurality of sub-pixels in different colors is disposed in an alternating manner. Accordingly, a pixel 430 of a second layer display forming a stack structure with the first layer display 410 may be disposed in a sequence of the G sub-pixel, the B sub-pixel, and the R sub-pixel. A pixel 440 of a third layer display may be disposed in a sequence of the B sub-pixel, the R sub-pixel, and the G sub-pixel.

Accordingly, when the first layer display 410, the second layer display, and the third layer display form the stack structure, a pixel 450 represented in the plurality of sub-pixels in different colors may be formed by combining the sub-pixels at a corresponding position of the pixel.

For example, the R sub-pixel of the first layer display 410 may overlap the G sub-pixel of the second layer display and the B sub-pixel of the third layer display. An image output at a position at which the R sub-pixel of the first layer display 410, the G sub-pixel of the second layer display, and the B sub-pixel of the third layer display overlap may represent a total of the RGB colors in a single sub-pixel area. Accordingly, the multilayer display apparatus may provide a higher resolution image than a resolution provided by a single layer display.

An array sequence of sub-pixels in the plurality of layer displays may be horizontal or vertical. Referring to FIG. 4, a horizontal array of the sub-pixels is illustrated, however, a vertical array of the sub-pixels is also possible. In a case of the sub-pixels in the vertical array, the plurality of layer displays may include a sub-pixel array in which a plurality of sub-pixels in different colors is disposed in an alternating manner.

Figure 5:
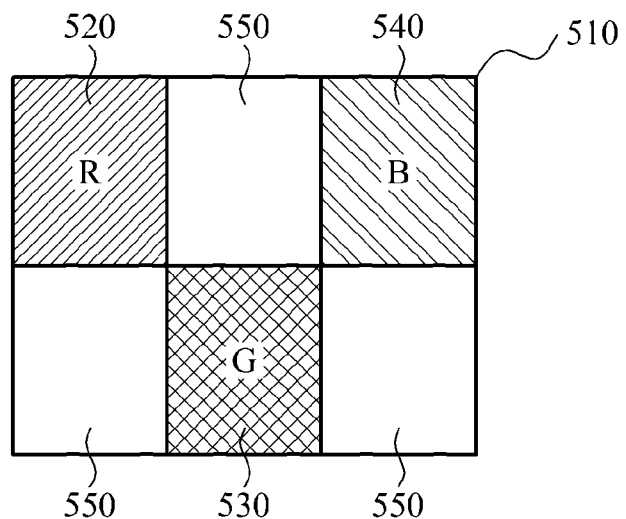
FIG. 5 illustrates an operation of outputting an image based on a plurality of non-overlapping sub-pixel arrays according to example embodiments.
Figure 5:
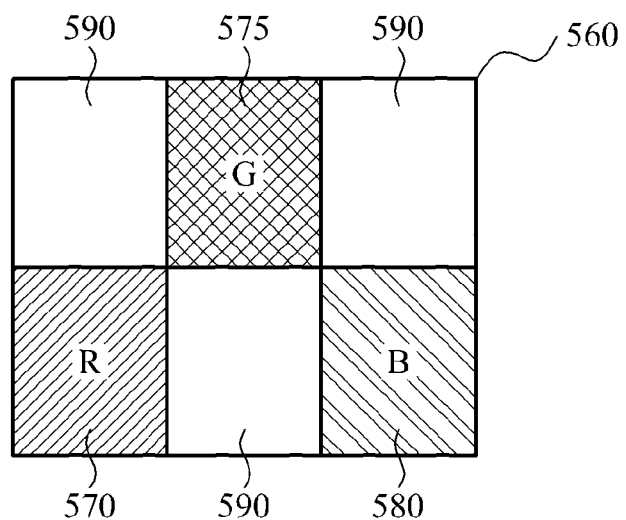

FIG. 5 illustrates an operation of outputting an image based on a plurality of non-overlapping sub-pixel arrays according to example embodiments.

The multilayer display apparatus may implement a layer-based display by changing a pixel array of a plurality of layer displays. Referring to FIG. 5, the multilayer display apparatus may include two layer displays, and a pixel of the two layer displays may include sub-pixels displaying an RGB color.

The multilayer display apparatus may change a sub-pixel array of the layer displays, such that a sub-pixel area between the plurality of layer displays is a non-overlapping sub-pixel area. A pixel 510 in a first layer display may include an R sub-pixel 520, a G sub-pixel 530, a B sub-pixel 540, and an area 550 in which an image is not represented. A pixel 560 in a second layer display may include an R sub-pixel 570, a G sub-pixel 575, a B sub-pixel 580, and an area 590 in which an image is not represented. An image of another layer display may be transmitted through the areas 550 and 590 in which the image is not represented.

The sub-pixels 520, 530, and 540 of the pixel 510 in the first layer display may include a non-overlapping array with respect to an array of the sub-pixels 570, 575, and 580 of the pixel 560 in the second layer display. Accordingly, although a stack structure is formed by overlapping the first layer display with the second layer display, an image represented by the first layer display and an image represented by the second layer display may both be represented.

The multilayer display apparatus may selectively display sub-pixels of the layer displays to form a non-overlapping sub-pixel array in the layer displays. For example, the multilayer display apparatus may form a sub-pixel array as the pixel 510 in the first layer display by displaying only the G sub-pixel 530 in a subsequent sub-pixel line, rather than display the G sub-pixel positioned between the R sub-pixel 520 and the B sub-pixel 540.

A portable device as used throughout the present specification includes mobile communication devices, such as a personal digital cellular (PDC) phone, a personal communication service (PCS) phone, a personal handy-phone system (PHS) phone, a Code Division Multiple Access (CDMA)-2000 (1X, 3X) phone, a Wideband CDMA phone, a dual band/dual mode phone, a Global System for Mobile Communications (GSM) phone, a mobile broadband system (MBS) phone, a satellite/terrestrial Digital Multimedia Broadcasting (DMB) phone, a Smart phone, a cellular phone, a personal digital assistant (PDA), an MP3 player, a portable media player (PMP), and an automotive navigation system (for example a global positioning system), for example. Also, the portable device as used throughout the present specification includes such devices as a digital camera, and a plasma display panel, for example.

The above-described embodiments may be recorded in non-transitory computer-readable media including program instructions to implement various operations embodied by a computer. The media may also include, alone or in combination with the program instructions, data files, data structures, and the like. The program instructions recorded on the media may be those specially designed and constructed for the purposes of embodiments, or they may be of the kind well-known and available to those having skill in the computer software arts. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. The computer-readable media may also be a distributed network, so that the program instructions are stored and executed in a distributed fashion. The program instructions may be executed by one or more processors. The computer-readable media may also be embodied in at least one application specific integrated circuit (ASIC) or Field Programmable Gate Array (FPGA), which executes (processes like a processor) program instructions. Examples of program instructions include both machine code, such as produced by a compiler, and files containing higher level code that may be executed by the computer using an interpreter. The described hardware devices may be configured to act as one or more software modules in order to perform the operations of the above-described embodiments, or vice versa.

Although embodiments have been shown and described, it would be appreciated by those skilled in the art that changes may be made in these embodiments without departing from the principles and spirit of the disclosure, the scope of which is defined by the claims and their equivalents.

What is claimed is:

1. A multilayer display apparatus, the apparatus comprising:
   a plurality of layer displays stacked on each other in an overlapping manner, each of the layer displays including image pixels and transparent pixels, the layer displays including at least a first layer display and a second layer display, a first image represented by the first layer display being displayed through the transparent pixels of the second layer display; and
   an image controller configured to provide a uniform display of an integrated image by,
      determining an alignment state between the layer displays using a sensor,
      adjusting a brightness of an image of each of the layer displays based on relative positions between the layer displays,
      compensating for a change in the brightness of an image occurring when a second image represented by the second layer display is transmitted to the first layer display, and
      correcting images represented by the layer displays by adjusting a position of a pixel corresponding to a pixel value of an image for the layer displays based on the determined alignment state.

2. The apparatus of claim 1, wherein when the plurality of layer displays are provided to overlap with each other, the image controller is further configured to output the integrated image based on a plurality of differing pixel arrays between the plurality of layer displays.

3. The apparatus of claim 1, wherein when the plurality of layer displays are provided to overlap with each other, the image controller is further configured to output the integrated image by overlapping images of the plurality of layer displays based on non-overlapping pixel arrays between the plurality of layer displays.

4. The apparatus of claim 3, wherein the non-overlapping pixel arrays comprise positions at which pixels representing the image are disposed in an alternating manner in the plurality of layer displays, and the pixels representing the image are disposed in a grid structure in each of the plurality of layer displays.

5. The apparatus of claim 1, wherein when the plurality of layer displays are provided to overlap with each other, the image controller is further configured to output the integrated image by overlapping images of the plurality of layer displays based on a plurality of sub-pixel positions.

6. The apparatus of claim 5, wherein the plurality of layer displays comprise a plurality of sub-pixels of different colors disposed in an alternating manner in the plurality of layer displays.

7. The apparatus of claim 1, wherein when the plurality of layer displays are provided to overlap with each other, the image controller is further configured to output the integrated image by overlapping images of the plurality of layer displays based on non-overlapping sub-pixel arrays.

8. The apparatus of claim 7, wherein the image controller is further configured to selectively display sub-pixels of the plurality of layer displays to control the integrated image to be output.

9. The apparatus of claim 1, wherein the image controller is further configured to correct an image to be represented on one layer display among the plurality of layer displays based on an alignment state of the plurality of layer displays, and output the corrected image using the plurality of layer displays.

10. The apparatus of claim 1, wherein each of the layer displays serves as an independent image.

11. A multilayer display apparatus, the apparatus comprising:
    a plurality of layer displays configured to overlap with each other, each of the layer displays including image pixels and transparent pixels, the layer displays including at least a first layer display and a second layer display, a first image represented by the first layer display being displayed through the transparent pixels of the second layer display; and
    an image controller configured to provide a uniform display of an integrated image by,
        determining an alignment state between the layer displays using a sensor,
        adjusting a brightness of an image of each of the layer displays based on relative positions between the layer displays,
        compensating for a change in the brightness of an image occurring when a second image represented by the second layer display is transmitted to the first layer display,
        correcting images represented by the layer displays by adjusting a position of a pixel corresponding to a pixel value of an image for the layer displays based on the determined alignment state.

* * * * *